United States Patent [19]

Beaudry, Jr. et al.

[11] Patent Number: 4,912,772
[45] Date of Patent: Mar. 27, 1990

[54] CONNECTOR AND CIRCUIT PACKAGE APPARATUS FOR PIN ARRAY CIRCUIT MODULE AND CIRCUIT BOARD

[75] Inventors: John S. Beaudry, Jr., Endicott; Peter A. Engel, Vestal; James R. Petrozello, Endicott; Steven R. Shinners, Owego, all of N.Y.

[73] Assignee: International Business Machines Corporation, Armonk, N.Y.

[21] Appl. No.: 319,503

[22] Filed: Mar. 6, 1989

[51] Int. Cl.$^4$ ............................................. H01R 23/68
[52] U.S. Cl. .................................. 361/413; 361/400; 439/79
[58] Field of Search ....................... 361/400, 413, 414; 439/67, 77, 79

[56] References Cited

U.S. PATENT DOCUMENTS

| | | | |
|---|---|---|---|
| 3,363,221 | 1/1968 | Stark | 339/177 |
| 3,638,166 | 1/1972 | Steipe | 339/61 M |
| 3,915,537 | 10/1975 | Harris et al. | 339/64 R |
| 4,059,323 | 11/1977 | Babuka et al. | 339/75 M |
| 4,076,357 | 2/1978 | Cistola | 339/17 M |
| 4,662,702 | 5/1987 | Furuya | 339/176 MP |
| 4,819,131 | 4/1989 | Watari | 361/413 |

OTHER PUBLICATIONS

"Thermal Conduction Module: A High-Performance Multilayer Ceramic Package", A. J. Blodgett et al., IBM J. Res. Dev., vol. 26, No. 1, Jan. 82, pp. 30–36.
"A New Set of Printed-Circuit Technologies for the IBM 3081 Processor Unit", D. P. Seraphim, IBM J. Res. Dev., vol. 26, No. 1, Jan. 82, pp. 37–44.
"Shielded Connector Assembly Using Metalized Plastic", IBM Tech. Discl. Bul., vol. 30, No. 12, May 1988, pp. 84–85.

*Primary Examiner*—Gregory D. Thompson
*Attorney, Agent, or Firm*—Norman R. Bardales

[57] ABSTRACT

In a circuit package having a connector for connecting a pin array circuit module and a printed circuit board, the connector is a molded plastic planar member with a plurality of openings extending through the member. In each opening, the member has two integral and spaced first and second parts having respectively oppositely aligned faces for receiving therebetween one of the pins. At least one of the parts resiliently extends across the opening, and at least one of the faces is a contact surface which mates with a pin of the module. A conductive layer with a predetermined circuit pattern is disposed on the member and includes conductors which extend from the contact surface to terminals disposed on the bottom surface of the member. The terminals are mateable with the input/output pads of the board. The member is disposed between the board and the module to provide the connection between the module and the board with the terminals of the member and the pads of the board being in contacting relationship. The pins of the module are disposed in the openings from the opposite surface of the member and each pin is extended and engaged by and between the respective faces of the paired parts in the particular opening in which the pin is inserted.

18 Claims, 6 Drawing Sheets

CONNECTOR AND CIRCUIT PACKAGE APPARATUS FOR PIN ARRAY CIRCUIT MODULE AND CIRCUIT BOARD

BACKGROUND OF THE INVENTION

1. Field of the Invention

This invention relates to connectors for electrically connecting a pin array circuit module and printed circuit board and the like, and electrical circuit packages for such components.

2. Description of the Prior Art

Connectors for connecting pin array circuit modules and printed circuit boards, and circuit package assemblies for such interconnected components, are well known in the art.

For example, in U.S. Pat. No. 4,059,323, "Apparatus For Interconnecting Plural Mating Members", R. Babuka et al, and assigned to the common assignee herein, there is disclosed a circuit package in which the input/output (I/O) pins of an integrated circuit module of the area array pin type are plugged into mating female members that are mounted in a corresponding array to a printed circuit board. The female members are metal connectors of the bifurcated spring type.

A description of one such type of bifurcated female connector is contained in U.S. Pat. No. 3,915,537, "Universal Electrical Connector", J. B. Harris et al, and assigned to the common assignee herein. It has a U-shaped configuration, the arms of which extend upwardly from a common main body portion. The contact surfaces are located on the inward faces of the resilient arms. The female connector has a stem, the upper end of which depends from the main common body portion. Part of the lower end of the stem is mounted to the board. When the connectors are mounted in an array to the board by their stems, the main body portion, resilient arms and contact surfaces of each connector are in an upright position and are extended at a uniform height above the surface of the printed circuit board. The connectors in the array are mounted to the board with the same identical orientation. In a manner well known to those skilled in the art, the female connector is mounted to the board by locating the lower end of the stem portion of the connector in and bonding it to one of the plated through holes (PTHs) of the printed circuit board, which holes are arranged in an array corresponding to the pin array of the module. Each such plated through hole is connected to preselected one or more circuit layers of the board. As a result, when the pin of the module is plugged into its mating female connector, the pin will be connected to the circuitry of the board to which the particular female connector is connected, thus connecting the circuitry of the module that is connected to the pin to the particular one or more circuit layers of the board.

Affixed to the printed circuit board of the aforementioned U.S. Pat. No. 4,059,323 is a base carrier insulator member. It has an array of recesses opening corresponding to the array of of female connectors mounted to the board and hence to the array of the module pins. Each recess has two pockets in an open and facing adjoining relationship. The first pocket encompasses and houses the two resilient arms and associated contact surfaces of one of the bifurcated spring female members mounted in the board that pass into the recesses from one side of the base carrier insulator member. The second pocket is laterally offset from and opens into the first pocket as aforementioned. The module pins are initially inserted from the opposite side of the base member into their corresponding respective second pockets, and then with the assistance of a cam actuator means, the pins are moved in the lateral direction out of the second pockets and into the first pockets towards the opening formed in the spacing between the two arms of the female connector associated with the particular pin. When the pin engages the leading edges of the two arms, the motion of the pin continues. As a result, the pin pushes against the leading edges causing the stem to deflect, i.e. pivot, in the direction of pin movement. The pivoting occurs about an upper part of the stem that protrudes outwardly from the PTH in which it is mounted. The stem, and thus the two arms it carries, is pivotally deflected from the normal upright position of the protruding stem part. The deflection of the stem is stopped when the common body portion between the two arms of the connector is obstructed by the wall of the first pocket. The pin continues to travel in the same direction causing the pin to deflect the two arms of the connector away from each other in a direction transverse to the direction of the pin movement. As the pin continues to move in the same direction, it enters the space therebetween and slides between the two contact surfaces in a contact wiping and captivated action manner. The cam actuator next is adapted to then reverse the direction of the pin. As a result, the now captivated pin carries the female connector, and hence the protruding part of the stem moves from its deflected position back to its former upright position thus removing the stress in the stem. As such, the pin is now properly engaged with the female connector.

More detailed information about the aforedescribed type of electrical connector apparatus for connecting a pin array circuit module to a printed circuit board and electronic packaging apparatus incorporating the same may be found in the aforementioned patents and other references such as, for example, in the following articles: "Thermal Conduction Module: A High Performance Multilayer Ceramic Substrate" A. J. Blodgett et al, and "A New Set of Printed-Circuit Technologies for the IBM 3081 Processor Unit", D. P. Seraphim, IBM J. RES. DEVELOP, Vol. 26, No. 1, Jan. 1982, pp 30-36 and 37-44, respectively.

U.S. Pat. No. 4,076,357, "Laminated Programmable Microstrip Interconnector", A. B. Cistola, and assigned to the common assignee herein, is another example of a connector that interconnects a pin array module to a circuit board. The connector has laminated printed circuit subtrates which have wrap around conductive lands formed on their respective aligned common bottom edges. The commonly aligned laminations are mounted along their respective common bottom edges normal to the plane of the circuit board. The lands are soldered bonded to the aligned contact pads on the outer planar surface of the printed circuit board. Recesses which are inwardly formed from the opposite, i.e. top, common edges of the laminations house individual bifurcated metal spring connectors which mate with the pins of the module. Each bifurcated connector has a stem which is affixed, e.g. by a solder bond, to a printed circuit conductor on the particular lamination that is integrally connected with one of the lands located along the bottom edge of the lamination.

It is also known in the connector prior art to provide an electrical conductive layer on a plastic body, for example, cf. U.S. Pat. Nos. 3,363,221, 3,638,166 and 4,662,702 and the article entitled "Shielded Connector Assembly Using Metalized Plastic", IBM Technical Disclosure Bulletin, Vol. 30, No. 12, May 1988, pp 84-85.

Thus, in U.S. Pat. No. 3,363,221, co-axial and shielded cable connectors are made as plated plastic electrical connectors. More particularly, the connector is made with mating plug and jack connector halves that have electrically conductive plating on their respective plastic shell bodies.

In U.S. Pat. No. 3,638,166 a pin socket connector is configured as a U-shape plastic body that has a conductive layer on the the inwardly facing walls of the two legs of its U shape. A discrete wire conductor passes through a bore in the bottom of the plastic body and is connected to the conductive layer. Multiple sockets may be commonly ganged by being integrally formed from a common plastic bar, each socket having its own wire connector. The mating pin is held between two inwardly facing plated bulges formed at the free ends of the two plated resilient formed legs of the socket. The conductive layer is formed by electrolysis, by deposition of an electrically conductive lacquer or emulsion, by vapor depositing, or by forcing or pressing a metallic strip against the inwardly facing walls of the U shaped socket.

In U.S. Pat. No. 4,662,702, an electrical spring contact for a connector is essentially comprised of: a first metal layer of a desired conductivity selected from the group of copper, silver, gold, aluminum and the like and alloys of these metals, which first metal layer forms the contact element of the contact; a second metal layer having a required springiness selected from the group iron alloys as spring stainless steel, copper alloys as spring beryllium-copper alloy, a metal containing spring reinforcing agent such as whisker and the like, amorphous metal and the like, and may be preferably selected from iron, cobalt, titanium, zirconium and nickel base alloys, which second layer provides the spring characteristics for the contact; and a plastic layer interposed between the two metal layers for their support. The plastic material is selected from epoxy, polyester, polyimide, polyamide or polyolefin resin and the like and may preferably be selected from the group of phenol, amino, epoxide, furan, polyether, ally, polyimide, polyamide, polyester, polycarbonic ester, polyphenylene sulfide, polyolefin, vinyl and silicone resins. The metal layers may be affixed to the plastic layer by an adhesive bond, or by means of electroplating, vapor deposition or spattering or ion planting.

In the aforementioned IBM Technical Disclosure Bulletin article, the plastic housings of an electrical connector assembly are metalized to reduce connector cross-track noise in a high speed, impedance-controlled digital transmission system.

The aforedescribed prior art connectors and circuit packages, while found to be generally satisfactory for certain high density applications, are not readily amenable for present higher density applications, i.e. higher density circuits and/or higher density pin arrays, e.g. arrays with 2000 or more pins. Moreover, the prior art devices have configurations which are complex and/or have a relative high number of moving parts and/or are susceptibility to deformation during their formation, assembly or disassembly and/or mating. The prior art devices, in addition, are not amenable to miniaturization or precision alignment between mating members and hence adversely effect the reliability required for such higher density applications.

SUMMARY OF THE INVENTION

An object of this invention is to provide an improved electrical connector for connecting a pin array circuit module to a printed circuit board and the like, and an improved circuit package for such components.

Another object of this invention is to provide an electrical connector and package of the aforementioned kind which is highly reliable, readily assembled and/or disassembled, relatively non-deformable or non-damagable, relatively simple, and easily effects mating between the pins and the contacting elements of the connector.

Still another object of this invention is to provide an electrical connector and package of the aforementioned kind that is readily amenable to high density and/or microminiature applications.

Another object of this invention is to provide an electrical connector of the aforementioned kind for side and/or top entry pin type connections and packaging assemblies.

According to one aspect of the present invention there is provided connector apparatus for connecting at least one circuit module and a printed circuit board. More particularly, the module has a plurality of input-/output pins in a predetermined first array. The board has a plurality of input/output printed circuit conductor contacts in a predetermined second array on a predetermined outer planar surface of the board. The connector apparatus has a molded plastic member with planar first and second surfaces. Plural openings extend through the member between its first and second surfaces. The openings are disposed in the member in a third array. The third array of the openings is substantially compatible, i.e. corresponds, to the first array of the pins. The member has a plurality of pin connectable means. Each of the pin connectable means is integrally connected to the member in a mutually exclusive one of the openings. Furthermore, each of the pin connectable means has at least two spaced first and second parts which have respectively oppositely aligned faces for receiving therebetween one of the pins. At least one of the parts is resiliently extended across the opening. A conductive layer having a predetermined circuit pattern is disposed on the member. The circuit pattern has plural predetermined conductors, and each of the last mentioned predetermined conductors has at least one terminal. The terminals are disposed in a fourth array on the second surface of the member. The fourth array of the terminals is substantially compatible to the second array of the aforementioned input/output board contacts. Each of the aforementioned predetermined conductors of the circuit pattern is extended onto at least one face of at least one of the parts of one or more of the pin connectable means. The member is disposed between the circuit board and the module to provide the connection between the module and the board. More particularly, during connection, the terminals on the second surface of the member and the printed circuit conductor contacts on the outer layer of the board are in contacting relationship at corresponding locations of the respective second and fourth arrays, and each of the pins of the module are disposed inwardly from the first surface of the member into one of the openings at the corresponding locations of the respective first and third arrays and in contacting relationship with the respective at least one face to which the particular one of the aforementioned predetermined conductors is extended and such that the pin is engaged by and between the respective two parts at the respective faces thereof in the particular opening in which the particular pin is disposed.

According to another aspect of the present invention there is provided circuit package assembly apparatus which includes in combination the aforementioned connector apparatus, at least one circuit module, and printed circuit board.

The foregoing and other objects, features and advantages of the invention will be apparent from the more particular description of the preferred embodiments of the invention, as illustrated in the accompanying drawing.

BRIEF DESCRIPTION OF THE DRAWING

In the figures, like elements are designated with similar reference numbers.

DESCRIPTION OF THE PREFERRED EMBODIMENTS

Figure 1:
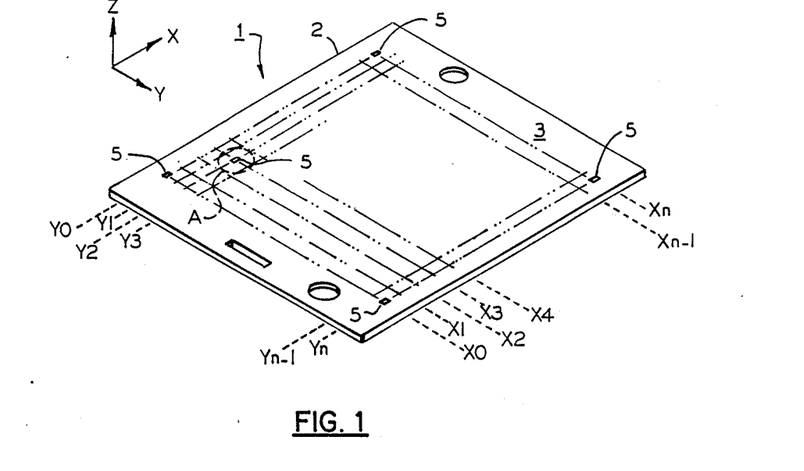
FIG. 1 is a schematic perspective view of a preferred embodiment of the connector apparatus of the present invention.

Referring to FIG. 1, a preferred embodiment of the connector apparatus shown therein is generally indicated by the reference number 1. The connector apparatus 1 has a molded insulator plastic member 2 which has planar first and second parallel surfaces 3 and 4, cf. FIGS. 3-5. A plurality of openings 5 extend through member 2 between surfaces 3 and 4. Openings 5 are disposed in member 2 in a predetermined array, which by way of example is shown as a rectangular array having orthogonal rows X0, X1, . . . Xn-1, Xn and columns Y0, Y1, . . . Yn-1, Yn parallel to the X and Y axes, respectively, of the XYZ orthogonal axes reference datum, FIG. 1, shown in the figures for sake of explanation. Opening 5 and parts of the openings adjacent to it, which are encompassed within the dashline circle shown in FIG. 1 and indicated by the reference character A, are shown in greater detail in FIG. 2 and are herein next described.

Figure 2:
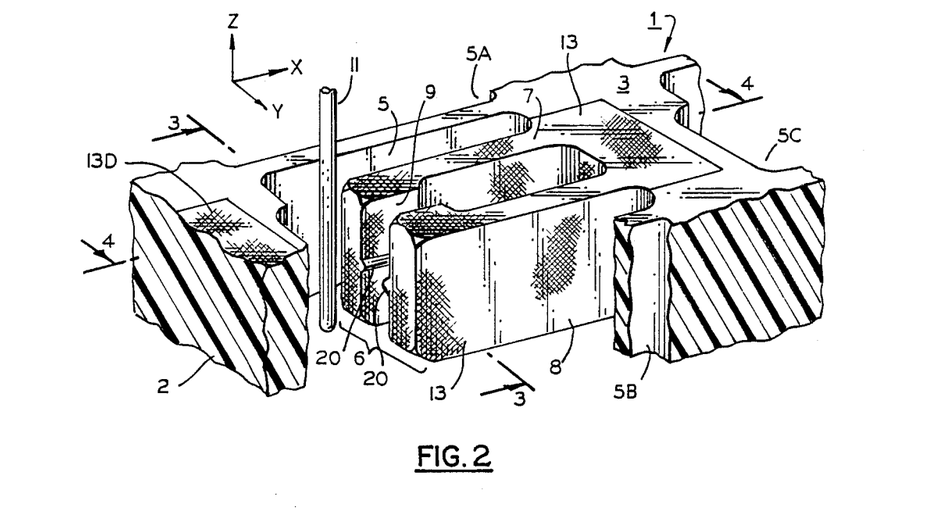
FIG. 2 is a schematic partial enlarged detail perspective view, partially broken away for sake of explanation, of one of the connector elements of the apparatus of FIG. 1.

More particularly, in FIG. 2, the partially shown two openings, designated by the reference characters 5A and 5B, are located in respective columns Y1 and Y3 of the opening array of member 2 that are adjacent to the column Y2 therebetween in which opening 5 of FIGS. 2-5 is located. Moreover, openings 5A, 5, and 5B of FIG. 2 are located in the same row X3 of the opening array of the member 2. In a similar manner, the partially shown two openings in FIG. 4, designated by the reference characters 5C and 5D, are located in respective rows X4 and X2 of the opening array of member 2 that are adjacent to the row X3 therebetween in which the opening 5 of FIGS. 2-5 is located; and the openings 5C, 5 and 5D are located in the same column Y2 of the opening array of the member 2. The opening 5D is omitted in FIG. 2 for sake of clarity.

Referring to FIG. 2 in greater detail, each opening 5 is transversed by a mutually exclusive pin connectable means, generally indicated by the reference character 6. Each of the pin connectable means 6 is integrally connected to the member 2, and is preferably molded concurrently with the other molded features of the member 2. Furthermore, each of the pin connectable means 6 has at least two spaced first and second parts 7 and 8 which have respectively oppositely aligned faces 9 and 10 for receiving therebetween one of the pins. At least one of the parts 7 and 8 is resiliently extended across the opening. In the embodiment of FIGS. 1-5, the two integrally connected parts 7 and 8 of means 6 are formed, i.e. configured, as the arms of a generally U-shape, i.e. bifurcated, configuration, and both arms, i.e. parts 7 and 8, are resilient. As aforementioned, the parts 7 and 8 have respectively oppositely aligned faces 9 and 10 for receiving therebetween a mateable pin 11, the pin 11 being one of an array, not shown, of plural pins of a pin array circuit module 12 partially shown in FIG. 4. It should be understood that the pin array of module 12 and the array of openings 5 are compatible. That is to say, the pins 11 and the openings 5 have corresponding locations in their respective arrays. Accordingly, each pin of module 12 is in alignment with one of the openings 5 when the pins of the module 12 are inserted into their respective openings 5, and/or mated as hereinafter described. It should also be understood that the plural pin connectable means 6 in the openings 5 are substantially identical and identically oriented therein. The pin array module 12 preferably has one or more integrated circuit chips, not shown, electrically connected and mounted to a pin carrier circuitized ceramic substrate.

To connect the pins, e.g. pin 11, of module 12 to a printed circuit board, in the connector apparatus 1, there is provided on the member 2 a circuitized conductor layer which has a predetermined circuit pattern. For sake of simplicity, only a part of the circuit pattern of the circuitized layer is described and shown in greater detail in FIGS. 2–5. Preferably the circuitized layer of member 2 is a suitable metal plating, for example copper plating or the like.

Figure 3:
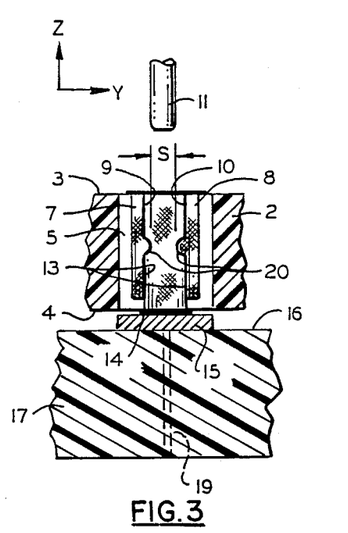
FIG. 3 is a schematic partial cross sectional view taken along the line 3—3 of FIG. 2 of a preferred embodiment of the circuit package assembly apparatus of the present invention and of the connector element of FIG. 2 as a part thereof, and illustrating a pin of the module of the circuit package assembly apparatus prior to its insertion into the opening of the connector element.
Figure 4:
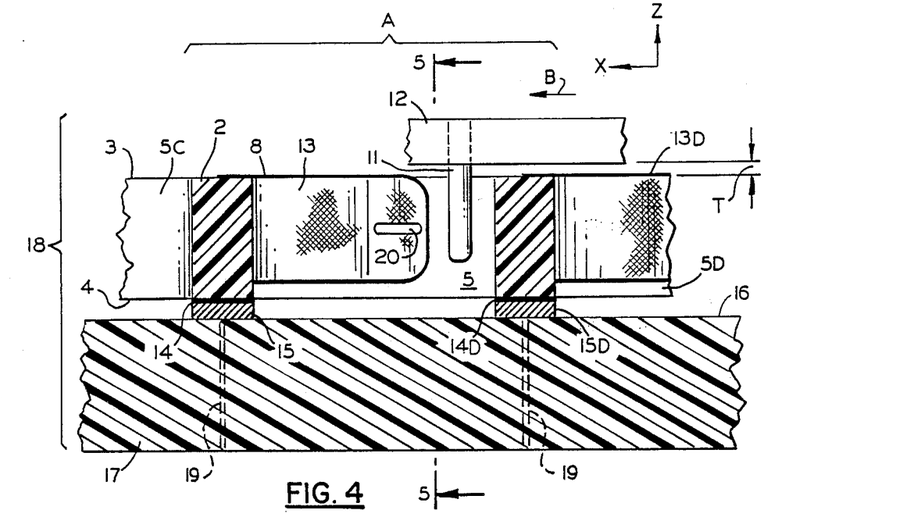
FIG. 4 is a schematic partial cross sectional view of the circuit package apparatus of FIG. 3 taken along the line 4—4 of FIG. 2 after the pin of FIG. 3 has been inserted into the opening of the connector element and prior to the mating of the pin with the contacts thereof.
Figure 5:
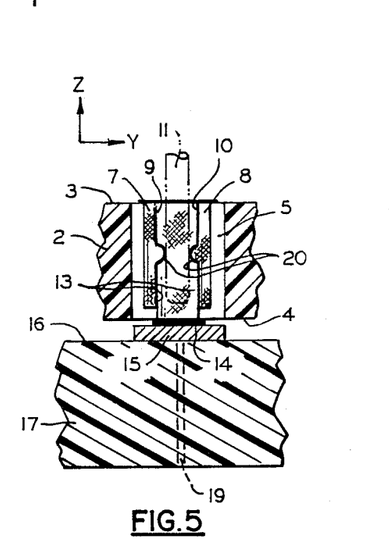
FIG. 5 is a schematic cross sectional view of the circuit package assembly apparatus of FIG. 3 taken along the line 5—5 of FIG. 4 after the pin of FIG. 4 has been mated with the contacts of the connector element.

More particularly, in FIGS. 2–5, a conductor 13, which is part of the aforementioned predetermined circuit pattern formed in the conductive layer disposed on member 2, has a pad or terminal 14 on the surface 4 of the member 2. The conductor 13 extends onto at least one, and preferably as shown both, of the faces 9 and 10 of the parts 7 and 8 of means 6 to provide a contact surface on the particular face 9, 10 for engagement with the pin 11. It should be understood that, in FIGS. 3 and 5 and partially in FIG. 4, those parts of the partially shown conductive pattern of the circuit layer which are overlaid on those parts of the member's (i.e. member 2) surfaces which are in planes normal to the planes of FIGS. 3–4 are illustrated as a heavy line, and that in FIG. 2 and partially in FIG. 4, those parts of the conductive pattern of the circuit layer which are overlaid on the member's surfaces which are in planes oblique or parallel to the planes of FIGS. 2 and 4 as viewed facing the latter figures are illustrated with partial orthogonal shading lines. The opening 5, means 6, conductor 13 and terminal 14 in combination form one of the connector elements of the connector apparatus 1. It should also be understood that conductor 13 is just one of plural predetermined conductors of the circuit pattern. For example, another one of these plural conductors is the partially shown conductor 13D, cf. FIGS. 2 and 4, that is associated with the adjacent opening 5D partially shown in FIG. 4. Also, each of these predetermined conductors has a terminal, e.g. terminal 14, disposed on the surface 4 of member 2, and each of these conductors, as aforementioned, extends onto at least one but preferably onto both faces of at least one means 6 in one of the openings 5 of member 2. As a result, each means 6 is connected to at least one terminal. In the preferred embodiment of FIGS. 1–5, each terminal is connected to a mutually exclusive one of the means 6.

The terminals on the surface 4 of member 2 are connectable to the input/output printed circuit contacts, i.e. pads, disposed on the outer surface of a printed circuit board. Thus, as shown in in FIGS. 3–5, terminals 14 and 14D are connectable, e.g. by a solder reflow bond, to the input/output pads 15 and 15D, respectively, disposed on the outer surface 16 of the printed circuit board 17. The terminals and pads (e.g. terminal 14 and pad 15) are disposed on the surfaces 4 and 16, respectively, in substantially compatible arrays. Accordingly, each terminal on the surface 4 of member 2 is in alignment, and hence registration, with one of the pads on the surface 16 of board 17 when the particular terminal is connected to the particular pad, cf. terminals 14 and 14D and associated pads 15 and 15D, respectively, FIGS. 3–5. As such, the pins (e.g. pin 11) of module 12 are connectable to the printed circuit board 17 via the latter's input/output pads (e.g. pad 15) by virtue of the connector apparatus 1. Thus, as is apparent to those familiar with the art, the circuit pattern of the apparatus 1 provides electrical paths from the contact faces of the bifurcated means 6 to the terminals 14 by virtue of the wrap around conductors (e.g. conductor 13) of the connector apparatus 1 which extend from the faces of the parts of the pin connectable means (e.g. faces 9 and 10 of parts 7 and 8 of means 6) in the openings (e.g. opening 5, FIGS. 2–5) to the terminals (e.g. terminal 14) on the surface 4 of member 2.

When assembled, cf. FIG. 4, the connector apparatus 1 is positioned between the board 17 and the module 12, and, more particularly, member 2 is disposed between the board 17 and the module 12 to provide the connection between the module 12 and board 17. The resultant assembly provides a preferred embodiment, designated by the reference character 18 in FIG. 4, of the circuit packaging apparatus of the present invention. Preferably, the board 17 is an epoxy glass multilayer circuit board, the layers of which are interconnected in a manner well known to those skilled in the art by a network of conductive vias, e.g. vias 19 shown in phantom outline in FIG. 4 for sake of clarity. Vias 19 may be, for example, plated through holes. The input/output pads, e.g. pad 15, which are part of the outer circuitized layer on the surface 16 of board 17, are directly and/or indirectly connected to the vias by conductors, not shown, of the outer circuitized layer on surface surface 16.

The preferred embodiments of the connector and packaging apparatus 1 and 18 of FIGS. 1–5, are configured as what is referred to in the art as a side entry type, that is to say, the contact wiping action is transverse to the longitudinal axis of the pin. To assemble the apparatus of FIGS. 1–5, the surface 4 of member 2 is juxtaposed to the surface 16 of board 17 with the respective corresponding mating terminals and pads in alignment and contacting relationship, and preferably affixed at the respective interfaces of the terminals and pads by a solder reflow bond. The module 12 is juxtaposed with the pins 11 facing surface 3 of member 2 and with the respective corresponding pins 11 and openings 5 in alignment, cf. FIG. 3. The pins 11 are then inserted in the downward direction, i.e. parallel to the Z axis, into the aligned openings 5 offset from the means 6, which is to the right of the particular means 6 as viewed facing FIG. 4. Preferably, a spacing T is provided between the member 2 and the inserted module 12 by suitable means, such as, for example, by standoffs, not shown, provided on the module 12.

In a manner well known to those skilled in the art, also provided are suitable locator means, e.g. locator holes and locator pins, which substantially places the pins 11 in alignment with the center horizontal axis passing between the two parts 7 and 8, which center axis is substantially parallel to the X reference axis. The locator means, not being part of the present invention, are omitted herein for sake of clarity. Thereafter, the module 12 is moved laterally in the direction B, cf. FIG. 4, which is parallel to the X reference axis. The diameter of the pin 11 is judiciously selected to be greater than the spacing S between the contact faces 9 and 10 so that the pin 11 upon contacting the faces 9 and 10 will cause the resilient parts 7 and 8 to deflect away from each other in a direction parallel to the Y reference axis, thereby causing the pin 11 to be resiliently captured by the arms, i.e. parts, 7 and 8 between the connectively layered surfaces 9 and 10, cf. FIG. 5. In this regard, in coaction with the contact pressure exerted by the resilient parts 7 and 8 and the movement of the pin 11 across the surfaces 9 and 10, each contact element of the connector apparatus 1 provides a contact wiping action. If desired, a suitable actuator and camming means, not shown, may be provided to move the pins 11 into and out of engagement with their respective mating contacts and as such limit the travel of the pins 11 to substantially the midpoint of the surfaces 9 and 10 as measured in the X axis direction. The actuator and camming means, not being part of the present invention, are omitted herein for sake of clarity. To enhance further the wiping action and/or contact pressure at the contact interfaces between the pins 11 and surfaces 9 and 10, the elongated contact protrusions 20 may be integrally formed in the faces 9 and 10. To disconnect the pin 11, the pin is moved in the reverse lateral direction until it is free and clear from the surfaces 9 and 10.

Accordingly, when the connector apparatus 1 of circuit package apparatus 18 connects the module 12 to the board 17, i.e. during the connection by the connector apparatus 1 of the module 12 and the board 17, the terminals, e.g. terminal 14, on the surface 4 of member 2 and the printed circuit conductor contacts, e.g. contact 15, on the outer layer 16 of board 17 are in contacting relationship at corresponding locations of their respective terminal and pad arrays. Moreover, during the connection, each of the module pins are disposed inwardly from the surface 3 of member 2 into one of the openings, e.g. opening 5, of the member 2 at the corresponding locations of their respective pin and opening arrays and are in contacting relationship with the respective contact faces 9, 10 to which the predetermined conductors of the circuit pattern associated with the member 2 are extended, the module pins being engaged by and between their particular respective two parts 7 and 8 at the respective faces 9 and 10 thereof of the transverse pin connectable means, e.g. means 6, which are in the openings, e.g. opening 5, in member 2.

To disengage the pins 11 from the faces 9 and 10 to which the pins are mated, as aforementioned, the pins are moved in a lateral direction reverse to the arrow B and out of engagement with the faces 9 and 10. The module 12 and pins 11 would then be lifted out of member 2.

In the embodiment of FIGS. 2-5, the pin connectable means 6 only partially extends across the opening 5. Alternatively, as shown in the embodiment of the partially shown connector apparatus 1' of FIGS. 6-7, each pin connectable means 6' of the member 2' extends completely across the opening 5'. More particularly, the parts 7' and 8' of the means 6', which are integral with the main body of the member 2', transverse the opening 5' and have formed therein protruding inwardly facing surfaces 9' and 10', each having an elongated contact protrusion 20' similar to the protrusions 20 of FIGS. 2-3. As such, connector apparatus 1' has 180 degree interchangeability with respect to the horizontal center axis C located in the space between the parts 7' and 8'. Moreover, when used as a side entry type, the pin 11' of the module, not shown, may be inserted facing the surface 3' of member 2' into either the right or left pocket 21 or 22 of opening 5' as preselected, it being understood that all the pins of the module would be inserted in the same corresponding selected one of the pockets of the openings. Then, the pins would all be moved laterally in a direction towards and into the spacing between the contact faces 9' and 10' for engagement therewith. To disengage the pins from between the contact faces 9' and 10', the pins may be moved in the reverse lateral direction back into the pockets in which the pins were originally inserted, and then the module and pins may be lifted away from the member 2' to be removed. Alternatively, to disengage the pins, the pins could be moved in the same direction used to engage the pins and into the other pockets, whereupon the module and pins would be lifted away from and removed from the member 2'.

Figure 6:
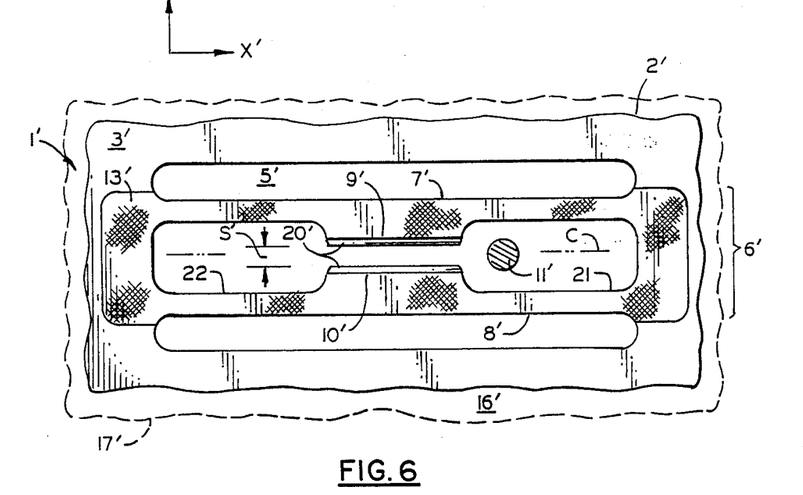
FIG. 6 is a schematic partial top view of other preferred embodiments of the connector apparatus and the partially shown circuit package assembly apparatus of the present invention.
Figure 7:
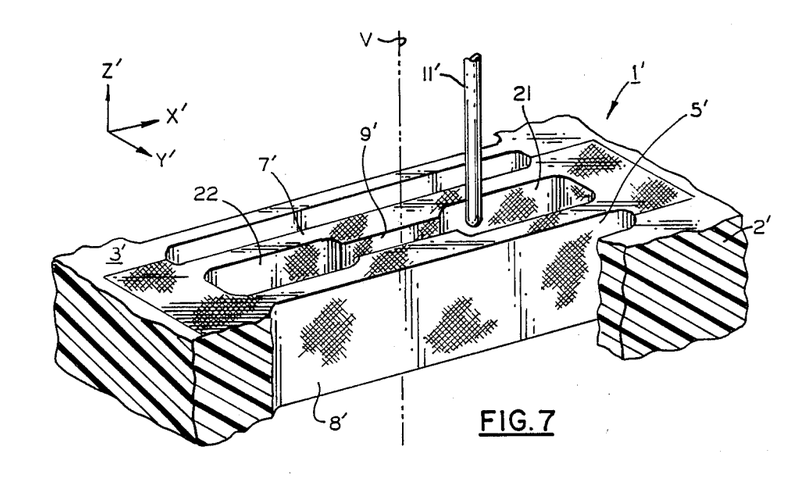
FIG. 7 is a schematic partially broken away perspective view of the connector element and module pin of FIG. 6 prior to the insertion of the pin therein.

The embodiment of FIGS. 6-7 may alternatively be used as a top entry type, that is to say the contact wiping action is parallel to the longitudinal axis of the pin. As such, the pins 11' of the module are positioned to face the surface 3' of member 2' in substantial coaxial vertical alignment with the vertical center axis V of the space between the surfaces faces 9' and 10' of the hole 5' with which the particular pin is aligned. The module and its pins are then advanced in the vertical direction parallel to the Z' axis towards the member 2' causing the particular pin 11' to enter the space between the faces 9' and 10' by deflecting the faces 9' and 10' in the Y' direction and to become engaged therebetween. To disengage the pins, the module and pins are lifted in a vertical direction away from the member 2'. In the embodiment of FIGS. 6-7, the elements 13', 16', 17', S' and X' are so designated for sake of clarity and correspond to their counterpart elements 13, 16, 17, S and X, respectively, in the embodiment of FIGS. 1-5.

Figure 8:
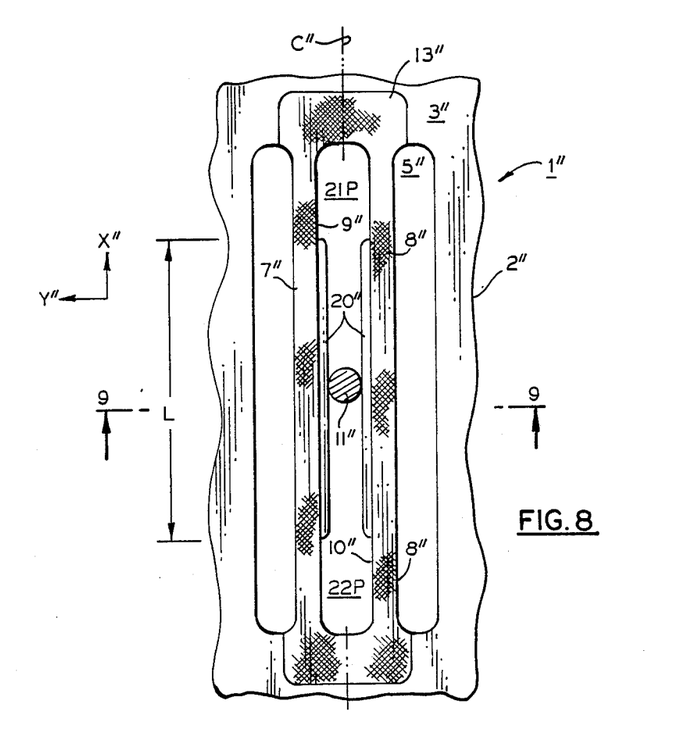
FIG. 8 is a partial schematic top view of still other preferred embodiments of the connector apparatus and the partially shown circuit package assembly apparatus of the present invention.
Figure 9:
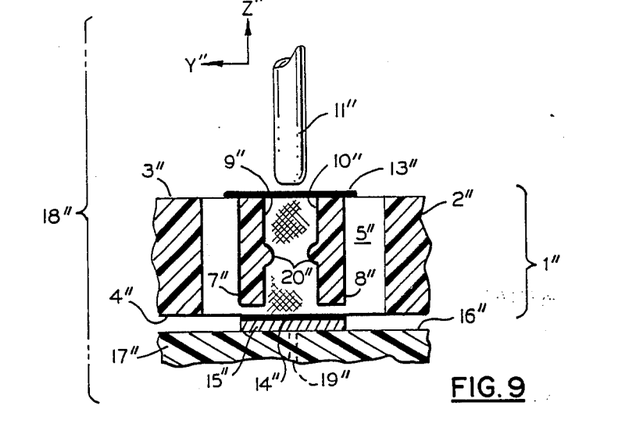
FIG. 9 is a partial cross sectional view of FIG. 8 of the connector element and module pin of FIG. 8 taken along the line 9—9 of FIG. 8 prior to the insertion of the pin therein.

The embodiment of FIGS. 8-9 has a configuration which is preferably used as a top entry type. To this end the faces 9" and 10", and more particularly, the protrusions 20" thereof, extend the length L substantially comparable to that of the parts 7" and 8", thereby providing a greater misalignment tolerance for the pins, e.g. pin 11", along the horizontal center axis C" than is the case if the faces were of shorter length. Alternatively, the embodiment of FIGS. 8-9, may be also operated as a side entry type, in which case the pin 11" would be placed in one of the preselected offset pockets 21P and 22P located adjacent to the ends of the parallel aligned protrusions 20"; whereupon, the pin 11" would be moved laterally toward and between the protrusions 20" in a manner similar to that described for the side entry operation of the embodiment of FIGS. 6-7. In the embodiment of FIGS. 8-9, the elements 1" to 5", 13" to 19", X", Y" and Z" are so designated for sake of clarity and correspond to their counterpart elements 1 to 5, 13 to 19, X, Y and Z, respectively, in the embodiment of FIGS. 1-5.

In the embodiments of FIGS. 1-9, the pin connectable means thereof has two resilient parts. However, as aforementioned, in certain applications, only one of the parts need be resilient.

Figure 10:
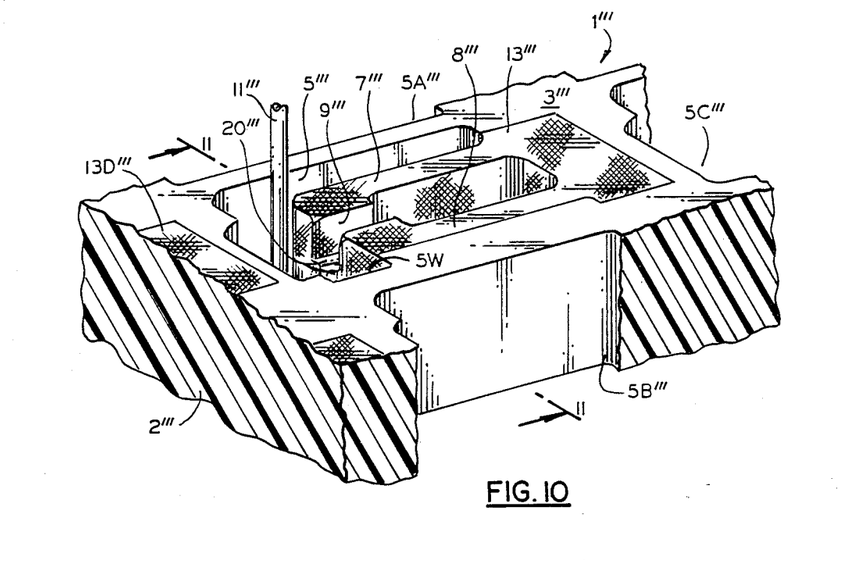
FIG. 10 is a schematic partial enlarged detail perspective view, partially broken away for sake of explanation, of one of the connector elements of still another embodiment of the connector apparatus of the present invention.
Figure 11:
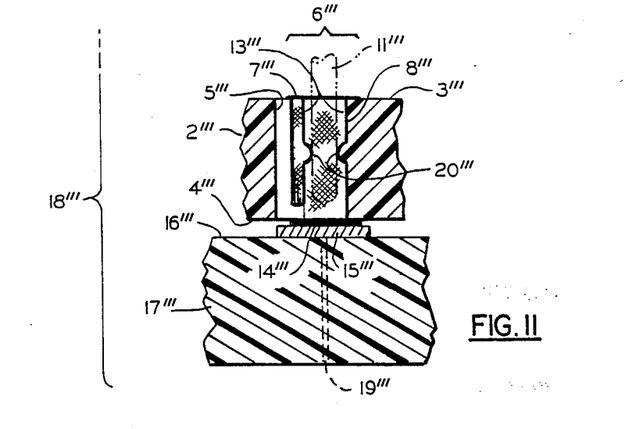
FIG. 11 is a schematic cross sectional view of another embodiment of the circuit package assembly apparatus of the present invention using the connector element of FIG. 10 taken along the line 11—11 of FIG. 10 after the pin has been mated with the contacts of the connector element.

Alternatively, the embodiments of FIGS. 1-9, the pin connector means may be modified to provide only one resilient part and the other part may be formed in the wall structure of the opening. Thus, for example, in the connector apparatus 1''' of FIGS. 10-11, each of the partially extended pin connectable means 6''' has two parts 7''' and 8''' but only part 7''' is resilient and the side wall 5W of the opening 5''' is the other part 8'''. In the embodiment of FIGS. 10–11, the elements 2''' to 4''', 5A''' to 5C''', 9''', 11''', 13''', 13D''' and 14''' to 20''' are so designated for sake of clarity and correspond to their counterpart elements 2 to 4, 5A to 5C, 9, 11, 13, 13D and 14 to 20, respectively, in the embodiment of FIGS. 1–5.

Figure 12:
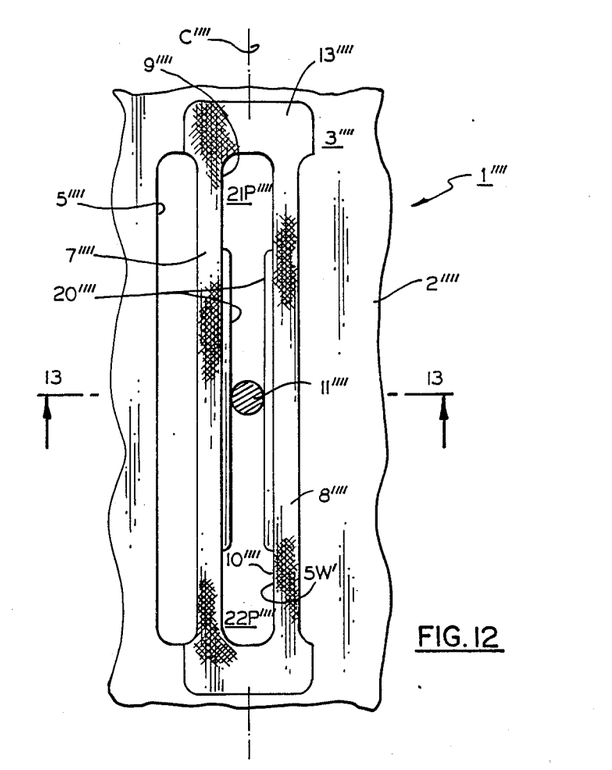
FIG. 12 is a partial schematic top view of still other preferred embodiments of the connector apparatus and the partially shown circuit package assembly apparatus of the present invention.
Figure 13:
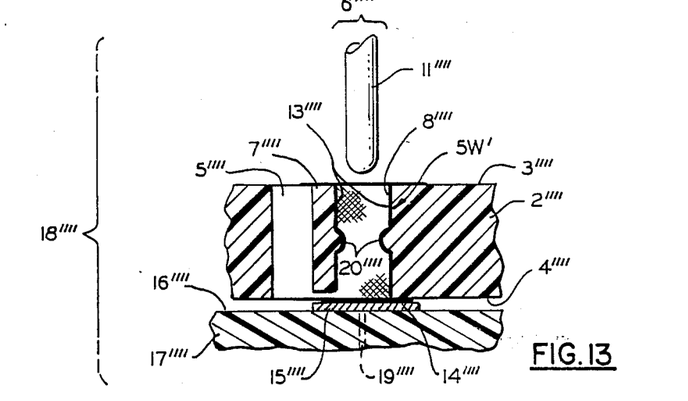
FIG. 13 is a partial cross sectional view of FIG. 12 of the connector element and module pin of FIG. 12 taken along the line 13—13 of FIG. 12 prior to the insertion of the pin therein.

Similarly, in the connector apparatus 1'''' of FIGS. 12–13, each of the completely extended pin connectable means 6'''' has teo parts 7'''' and 8'''' but only part 7'''' is resilient and the side wall 5W' of the opening 5'''' is the other part 8''''. In the embodiment of FIGS. 12–13, the elements 2'''' to 4'''', 9'''' to 11'''', 13'''' to 20'''', 21P'''', 22P'''' and C'''' are so designated for sake of clarity and correspond to their counterpart elements 2'' to 4'', 9'' to 11'', 13'' to 20'', 21P, 22P and C'', respectively, in the embodiment of FIGS. 8–9.

By judicious selection of the composition of the plastic member, the parameters of the two parts of the pin connectable means, and the shape of the joint(s) where the parts of the pin connectable means are integrally joined to the plastic member, deflection of the resilient one, or both as the case might be, of the two parts of the pin connectable means in the X and Z directions is substantially mitigated, but allows sufficient resiliency in the resilient part, or both parts as the case might be, to permit deflection in the Y direction in coaction with the module pin. Suitable plastic materials useful for forming the connector member of the present invention are high performance thermoplastics such as thermotropic liquid crystal polymers, e.g. Vectra registered trademark of the Celanese Corporation, and resins such as polyphenylene sulfide (PPS), e.g. Ryton registered trademark of the Phillips 66 Company, Inc.

Hence, the pin connectable means, as it can be readily seen from the figures, are not susceptible to adverse deflection and/or deformation as is the case for the discrete metal spring connectors such as the bifurcated spring connectors with stems of the prior art. Moreover, because of their respective configurations, the connector and/or package assembly apparatus of the present invention, is much simpler to connect/disconnect and/or assemble/disassemble than are the devices of the prior art.

It should be understood that the invention may be modified in other ways without departing from the principles of the invention. For example, in the preferred embodiments of the connector member and its openings have rectangular shapes, and the arrays of the openings and the module pins, as well as the arrays of the pads of the boards and the terminals of the connector member have rectangular coordinate arrays. However, as is apparent to those skilled in the art that other shapes and/or coordinate, e.g. polar, arrays may be used in practicing the present invention. Moreover, while the connector apparatus and its elements are shown as having symmetrical shapes and/or are arranged in symmetrical arrays and/or having aligned center to center spacings between the respective array adjacent rows and columns thereof, it should be understood that the apparatus and its elements may have asymmetrical shapes and/or array arrangements and/or offset spacing alignments between the adjacent rows and/or columns.

Likewise, it should be understood that the embodiments are shown schematically herein for sake of simplicity. Thus, for example, while the edges of the two parts of the pin connectable means where the module pin enters therebetween may be straight as shown, these edges are preferable beveled to facilitate entry of the pin. Likewise, where the conductive layer wraps around an underlying edge of the plastic member, the edge particularly in the underlying section thereof may be provided with a smooth transition between the two surfaces of the plastic member that are defining the particular edge, e.g. by beveling or rounding and the like, so as to enhance the integrity of the conductive wrap around during its formation thereon, as might otherwise be the case if the edge were to have a sharp profile. Moreover, if desired, a precious metal or other non-corrosive metal coating or plating, may be selectively deposited, e.g. by electroplating, over the copper plating aforementioned circuit pattern of the connector member and preferably on the contact faces of the pin connectable means, as well as on the terminals of the connector member which connect to the I/O pads, i.e. contacts, of the board.

Thus, while the invention has been described with reference to preferred embodiments thereof, it will be understood by those skilled in the art that various changes in form and details may be made without departing from the scope of the invention.

We claim:

1. Connector apparatus for connecting at least one circuit module and a printed circuit board, the module having a plurality of input/output pins in a predetermined first array, the board having a plurality of input-/output printed circuit conductor contacts in a second array on a predetermined outer planar surface thereof, said apparatus comprising:

a molded plastic member having planar first and second surfaces, a plurality of openings extending through said member between said first and second surfaces, said openings being disposed in said member in a third array substantially compatible to the first array, a plurality of pin connectable means, each of said pin connectable means being integrally connected to said member in a mutually exclusive one of said openings, each of said pin connectable means having at least two spaced first and second parts having respectively oppositely aligned faces for receiving therebetween one of the pins, and at least one of said parts being resiliently extended across said opening, and a conductive layer having a predetermined circuit pattern disposed on said member, said circuit pattern having plural predetermined conductors, each of said predetermined conductors having at least one terminal, said terminals of said predetermined conductors being disposed on said second surface in a fourth array substantially compatible to the second array, each of said predetermined conductors further being extended onto at least one face of at least one of said parts, said member being disposed between the board and the module to provide connection between the module and the board, said terminals on said second surface of said member and the printed circuit conductor contacts on the outer surface of the board being in contacting relationship at corresponding locations of the second array and said fourth array during the connection, and during the connection each of the pins of the module being disposed inwardly from said first surface of said member into one of said openings at the corresponding locations of the first array and said third array and in contacting relationship with the respective said at least one face to which one of said predetermined conductors is said extended and being engaged by and between the respective said two parts at the respective said faces thereof in the particular said opening in which the particular pin is said disposed.

2. Connector apparatus according to claim 1 wherein said first part comprises said at least one of said parts being resiliently extended across said opening, and wherein said member further has at least one wall comprising said second part, said wall being adjacent to said opening.

3. Connector apparatus according to claim 2 wherein said first part extends partially across said opening.

4. Connector apparatus according to claim 2 wherein said first part extends completely across said opening.

5. Connector apparatus according to claim 1 wherein both said first and second parts extend partially within said opening in a U-shape configuration having a pair of arms, said arms of said pair being said first and said parts, respectively, and both said parts are resilient.

6. Connector apparatus according to claim 1 wherein both said first and second parts extend completely across said opening, and both said parts are resilient.

7. Connector apparatus according to claim 1 wherein each of said pin connectable means receives the pins in a side entry manner between said first and second parts.

8. Connector apparatus according to claim 1 wherein each of said pin connectable means receives the pins in a top entry manner between said first and second parts.

9. Connector apparatus according to claim 1 wherein said conductive layer is a conductive plating.

10. In electronic package assembly apparatus, the combination comprising:
   at least one circuit module, said module having a plurality of input/output pins in a predetermined first array;
   a printed circuit board, said board having a plurality of input/output printed circuit conductor contacts in a second array on a predetermined outer planar surface thereof; and
   connector apparatus providing connection between said circuit module and said printed circuit board, said connector apparatus having:
      a molded plastic member having planar first and second surfaces,
      a plurality of openings extending through said member between said first and second surfaces, said openings being disposed in said member in a third array substantially compatible to said first array,
      a plurality of pin connectable means, each of said pin connectable means being integrally connected to said member in a mutually exclusive one of said openings, each of said pin connectable means having at least two spaced first and second parts having respectively oppositely aligned faces for receiving therebetween one of said pins, and at least one of said parts being resiliently extended across said opening, and
      a conductive layer having a predetermined circuit pattern disposed on said member, said circuit pattern having plural predetermined conductors, each of said predetermined conductors having at least one terminal, said terminals of said predetermined conductors being disposed on said second surface in a fourth array substantially compatible to said second array, and each of said predetermined conductors further being extended onto at least one face of at least one of said first and second parts,
   said member being disposed between said board and said module to provide said connection between said module and said board, said terminals on said second surface of said member and said printed circuit conductor contacts on said outer surface of said board being in contacting relationship at corresponding locations of said second and fourth arrays during said connection, and during said connection each of said pins of said module being disposed inwardly from said first surface of said member into one of said openings at the corresponding locations of said first and third arrays and in contacting relationship with the respective said at least one face to which one of said predetermined conductors is said extended and being engaged by and between the respective said two parts at the respective said faces thereof in the particular said opening in which the particular pin is said disposed.

11. Electronic package assembly apparatus according to claim 10, wherein said first part comprises said at least one of said parts being resiliently extended across said opening, and wherein said member further has at least one wall comprising said second part, said wall being adjacent to said opening.

12. Electronic package assembly apparatus according to claim 11, wherein said first part extends partially across said opening.

13. Electronic package assembly apparatus according to claim 11, wherein said first part extends completely across said opening.

14. Electronic package assembly apparatus according to claim 10, wherein both said first and second parts extend partially within said opening in a U-shape configuration having a pair of arms, said arms of said pair being said first and said parts, respectively, and both said parts are resilient.

15. Electronic package assembly apparatus according to claim 10, wherein both said first and second parts extend completely across said opening, and both said parts are resilient.

16. Electronic package assembly apparatus according to claim 10, wherein each of said pin connectable means receives said pins in a side entry manner between said first and second parts.

17. Electronic package assembly apparatus according to claim 10, wherein each of said pin connectable means receives said pins in a top entry manner between said first and second parts.

18. Electronic package assembly apparatus according to claim 10, wherein said conductive layer is a conductive plating.

* * * * *